(12) United States Patent
Uetani et al.

(10) Patent No.: US 9,950,965 B2
(45) Date of Patent: Apr. 24, 2018

(54) CERAMIC ELEMENT AND METHOD OF MANUFACTURING THE SAME

(71) Applicant: NGK INSULATORS, LTD., Nagoya (JP)

(72) Inventors: Masayuki Uetani, Nagoya (JP); Masaki Hattori, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 392 days.

(21) Appl. No.: 14/153,472

(22) Filed: Jan. 13, 2014

(65) Prior Publication Data
US 2014/0202629 A1    Jul. 24, 2014

(30) Foreign Application Priority Data
Jan. 18, 2013  (JP) .................................. 2013-007145

(51) Int. Cl.
*H01L 41/083*    (2006.01)
*H01L 41/187*    (2006.01)
(Continued)

(52) U.S. Cl.
CPC .......... *C04B 41/81* (2013.01); *H01L 41/0533* (2013.01); *H01L 41/23* (2013.01);
(Continued)

(58) Field of Classification Search
CPC . H01L 41/0533; H01L 41/083; H01L 41/187; H01L 41/23; H01L 41/277; H01L 41/338; C04B 41/81
See application file for complete search history.

(56) References Cited

U.S. PATENT DOCUMENTS 3,946,290 A * 3/1976 Yoshioka ................. H01G 2/12
361/306.1
4,916,000 A * 4/1990 Li .......................... A42B 3/062
428/105
(Continued)

FOREIGN PATENT DOCUMENTS

JP    H03-241802 A    10/1991
JP    2011-514608 A1    5/2011
(Continued)

OTHER PUBLICATIONS

European Office Action, European Application No. 14 151 044.6, dated May 7, 2015 (6 pages).
(Continued)

*Primary Examiner* — Linda L Gray
(74) *Attorney, Agent, or Firm* — Burr & Brown, PLLC (57) ABSTRACT

A ceramic element includes: a ceramic body; a first coating layer disposed on a first part of a front surface of the ceramic body; and a second coating layer disposed on a second part of a back surface of the ceramic body. The first coating layer continuously extends from the front surface to a first region of a side surface of the ceramic body, the side surface being a machined surface, and the first region being a front side region of the side surface. The second coating layer continuously extends from the back surface to a second region of the side surface of the ceramic body, the second region being a back side region of the side surface. In the machined surface, one of the first and second coating layers is disposed at least partially on the other of the first and second coating layers.

4 Claims, 8 Drawing Sheets

(51) Int. Cl.
*H01L 41/23* (2013.01)
*H01L 41/277* (2013.01)
*C04B 41/81* (2006.01)
*H01L 41/053* (2006.01)
*H01L 41/338* (2013.01)
*H01L 41/331* (2013.01)

(52) U.S. Cl.
CPC .......... *H01L 41/331* (2013.01); *H01L 41/338* (2013.01); *H01L 41/083* (2013.01); *H01L 41/187* (2013.01); *H01L 41/277* (2013.01); *Y10T 156/1082* (2015.01); *Y10T 428/23* (2015.01); *Y10T 428/232* (2015.01); *Y10T 428/239* (2015.01)

(56) References Cited

U.S. PATENT DOCUMENTS

| | | | |
|---|---|---|---|
| 5,750,264 A * | 5/1998 | Ueno | ............... C04B 35/47 428/426 |
| 2002/0014815 A1 | 2/2002 | Kurano et al. | |
| 2010/0208390 A1 | 8/2010 | Hanya et al. | |
| 2010/0327699 A1 | 12/2010 | Hassanali et al. | |
| 2011/0020585 A1 | 1/2011 | Steinfeldt et al. | |
| 2012/0183716 A1* | 7/2012 | Jordan | ............... B29C 70/088 428/47 |
| 2013/0009520 A1 | 1/2013 | Kobayashi et al. | |
| 2014/0027053 A1 | 1/2014 | Uetani et al. | |

FOREIGN PATENT DOCUMENTS

| | | |
|---|---|---|
| JP | 2011-249615 A | 12/2011 |
| WO | 2009/099438 A1 | 8/2009 |
| WO | 2012/133530 A1 | 10/2012 |

OTHER PUBLICATIONS

European Search Report, European Application No. 14151044.6, dated Apr. 22, 2014 (9 pages).

* cited by examiner

CERAMIC ELEMENT AND METHOD OF MANUFACTURING THE SAME

CROSS-REFERENCE TO RELATED APPLICATION

This application claims priority to Japanese Patent Application No. 2013-7145 filed on Jan. 18, 2013, the contents of which are hereby incorporated by reference into the present application.

BACKGROUND OF THE INVENTION

1. Field of the Invention

The present teachings relate to a ceramic element that includes a ceramic body, and to a method of manufacturing the same.

2. Description of Related Art

A method is publicly known for manufacturing a ceramic element (for example, a piezoelectric element or the like) by mechanical processing of a ceramic wafer (for example, by dicing or the like). With this type of ceramic element, there is a problem that ceramic particles can easily be dropped off from the machined surface of the ceramic body. Due to this, a technique has been developed for suppressing dropping of ceramic particles by coating the machined surface of the ceramic body with a coating layer (for example, refer to Japanese Patent Application Publication No. 2011-514608).

SUMMARY OF THE INVENTION

With prior art techniques for coating the machined surface of a ceramic body with a coating layer, there has been the problem that the coating layer that has been applied can easily become detached from the machined surface of the ceramic body. For example, if a plurality of ceramic elements is manufactured by mechanically dicing a ceramic wafer, then the coating layers that are subsequently coated upon the machined side surfaces of the ceramic elements can easily become detached at the edge portions of the ceramic elements (i.e. at the boundary portions between the side surfaces of the diced ceramic elements and their front surfaces, or at the edge portions between their side surfaces and their back surfaces) or the like. If the coating layer on a ceramic element becomes detached therefrom, then it becomes impossible to prevent subsequent shedding of ceramic particles from the ceramic element.

The object of the present teachings is to provide a technique with which, with a ceramic element in which a coating layer is coated upon the machined surface of a ceramic body, it is possible to suppress detachment of the coating layer from the machined surface.

A ceramic element disclosed herein includes a ceramic body including one or more laminated ceramic layers; a first coating layer disposed on a first part of a front surface of the ceramic body; and a second coating layer disposed on a second part of a back surface of the ceramic body. The first coating layer continuously extends from the front surface of the ceramic body to a first region of a side surface of the ceramic body, the side surface being a machined surface, and the first region being a frontside region of the side surface. The second coating layer continuously extends from the back surface of the ceramic body to a second region of the side surface of the ceramic body, the second region being a back side region of the side surface. In the machined surface of the ceramic body, one of the first and second coating layers is disposed at least partially on the other of the first and second coating layers.

With this ceramic element, the first coating layer and the second coating layer are formed upon the side surface of the ceramic body (in other words, upon its machined surface). The first coating layer is formed up to and onto a portion of the front surface of the ceramic body, and the second coating layer is formed up to and onto a portion of the back surface of the ceramic body. Due to this, it is possible to cover the ceramic body from its front surface through to its side surface, i.e. to cover its portion including the boundary (edge portion) between its front surface and its side surface where detachment can easily take place, with the first coating layer, without any break or discontinuity. Moreover, it is also possible to cover the ceramic body from its back surface through to its side surface, i.e. to cover its portion including the boundary (edge portion) between its back surface and its side surface where detachment can easily take place, with the second coating layer, without any break or discontinuity. Due to this, it is possible to suppress detachment of the coating layer from the machined surface of the ceramic body.

Further, another ceramic element disclosed herein includes: a ceramic body including one or more laminated ceramic layers; and a coating layer disposed on a part of a front surface of the ceramic body. The coating layer continuously extends beyond a side surface of the ceramic body, reaching a peripheral part of a back surface of the ceramic body. The coating layer is disposed on the entire side surface of the ceramic body. The side surface is a machined surface.

With this ceramic element, the coating layer that is formed upon the front surface of the ceramic body extends continuously, past and over the side surface of the ceramic body (i.e. past and over its machined surface), to the peripheral part of the back surface of the ceramic body. Due to this, the portions of the ceramic body where detachment can easily take place, i.e. the boundary portion (edge portion) between its side surface and its front surface and the boundary portion (edge portion) between its side surface and its back surface, are covered over with the coating layer without any break or discontinuity. Thus, it is possible to suppress detachment of the coating layer from the machined surface of the ceramic body.

Further, a method of manufacturing a ceramic element disclosed herein includes: fixing a back surface of a ceramic wafer on a supporting plate via a sacrifice layer, the ceramic wafer including one or more laminated ceramic layers; dicing the ceramic wafer in a state where the ceramic wafer is fixed to the supporting plate via the sacrifice layer, removing a part of the sacrifice layer from a groove of the ceramic wafer, the groove being formed by the dicing of the ceramic wafer, and after the removing, cleaning a front surface of the ceramic wafer in the state where the ceramic wafer is fixed to the supporting plate via the sacrifice layer.

With this method of manufacture, the ceramic wafer is washed in the state in which a ceramic body (each piece of diced wafer) is overhanging from the sacrificial layer. Due to this, it is possible effectively to eliminate in advance the ceramic particles that can easily be dropped off from the machined surface of the ceramic body (i.e. from its diced surface). Since the ceramic particles that can easily be shed are removed in advance, accordingly it is possible further to suppress shedding of ceramic particles from the ceramic body during use.

DETAILED DESCRIPTION OF THE INVENTION

In a ceramic element disclosed herein, in a planar view, a ceramic body may have a rectangular shape. A first coating layer (or may simply be referred to as a coating layer) may be disposed on at least four corners of the front surface of the ceramic body. According to this type of configuration, it is possible effectively to suppress shedding of ceramic particles, since the four corners of the ceramic body, from which shedding of ceramic particles can easily take place, are covered over with the coating layer.

In the ceramic element disclosed herein, the coating layer (first coating layer) may be disposed along peripheral edges of a front surface of the ceramic body. According to this type of configuration, it is possible effectively to suppress shedding of the ceramic particles, since the boundary between the front surface of the ceramic body and its side surface (i.e. its edge portion) is covered over.

A method of manufacturing the ceramic element disclosed herein may include, after cleaning, spraying coating material on a side surface of a ceramic body, the side surface being exposed in a groove of the ceramic wafer, and fixing a coating material on the ceramic wafer by curing the coating material sprayed on the side surface of the ceramic wafer. In the spraying, the coating material may be sprayed on the side surface of the ceramic body (each piece of diced wafer) such that a peripheral edge of the back surface of the ceramic body is covered with the coating material after the fixing of the coating material. According to this type of configuration, it is possible to manufacture another type of ceramic element disclosed in the above specification.

First Embodiment

Figure 1:
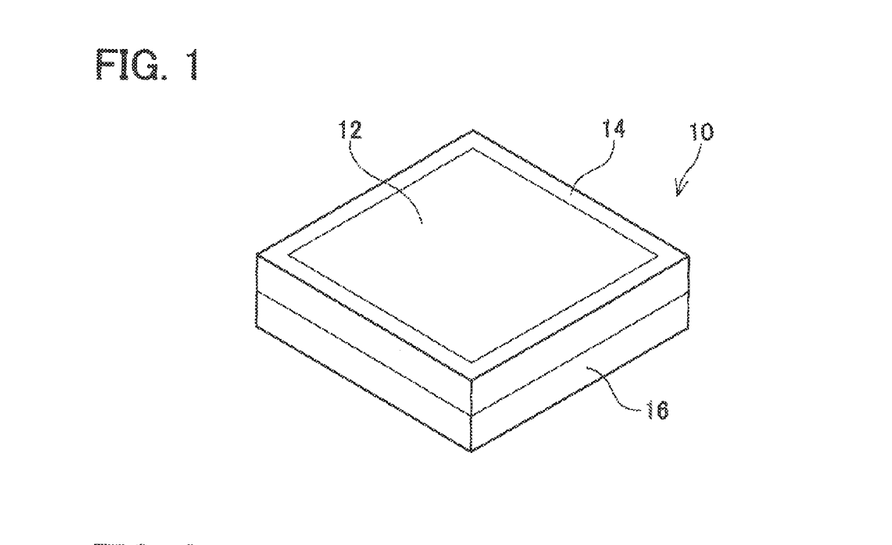
FIG. 1 is a perspective view of a piezoelectric element according to a first embodiment.

As shown in FIG. 1, a piezoelectric element 10 according to the first embodiment is an example of a ceramic element, and comprises a piezoelectric body 12 and resin coating layers 14 and 16. The resin coating layer 14 covers a portion of the front surface and a portion of the side surface of the piezoelectric body 12. And the resin coating layer 16 covers a portion of the back surface and a portion of the side surface of the piezoelectric body 12. The entire side surface of the piezoelectric body 12 is covered over by the combination of the resin coating layers 14 and 16. Since the side surface of the piezoelectric body 12 is covered over by the combination of the two resin coating layers 14 and 16, accordingly the boundary between the two resin coating layers 14 and 16 runs along an intermediate portion of the side surface of the piezoelectric body 12.

Figure 2:
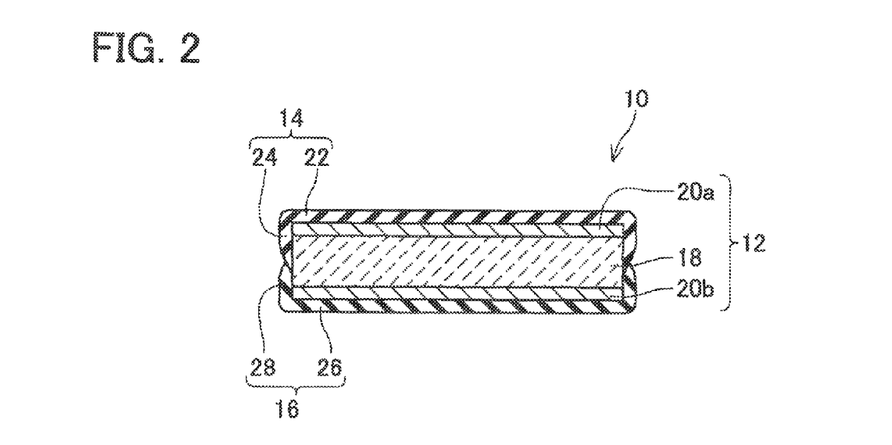
FIG. 2 is a vertical sectional view of the piezoelectric element shown in FIG. 1 (i.e. is a vertical sectional view of a portion upon which a resin coating layer is formed)

As shown in FIG. 2, the piezoelectric body 12 comprises a piezoelectric layer 18 and surface electrodes 20a and 20b that are respectively provided upon the front surface and the back surface of the piezoelectric layer 18. The piezoelectric layer 18 is made from a publicly known piezoelectric material. For example, PZT ceramics ($Pb(Zr,Ti)O_3$), titanium oxide-barium ceramics, a titanium oxide-lead ceramics, or the like may be used as the piezoelectric material. In planar view, the piezoelectric layer 18 is shaped as a rectangular plate. Incidentally, while in this embodiment the piezoelectric body 12 is made with a single piezoelectric layer 18, it would also be possible to build the piezoelectric body 12 by laminating together a plurality of piezoelectric layers. In this case, by providing internal electrode layers between adjacent piezoelectric layers, it would be possible to make it possible to apply voltage to each of the piezoelectric layers.

The surface electrode 20a is formed over the entire front surface of the piezoelectric layer 18, and similarly the surface electrode 20b is formed over the entire back surface of the piezoelectric layer 18. The surface electrodes 20a and 20b are made from a publicly known electrode material. For example, platinum (or the like), silver, Ag—Pd alloy, gold, nickel, copper, or the like may be used for the electrode material. The surface electrodes 20a and 20b may be manufactured by a publicly known method (for example, a method of screen printing and firing an electrically conductive paste, a spattering method, a vacuum vapor deposition method, or the like).

The resin coating layers 14 and 16 are made from a publicly known resin material. For example, polyimide, epoxy resin, urethane, or the like may be used as the resin material. As shown in FIGS. 1 and 2, the resin coating layer 14 extends continuously from the front surface of the piezoelectric body 12, around to and over part of its side surface. The resin coating layer 14 includes a front surface covering portion 22 that is formed upon part of the from surface of the piezoelectric body 12, and a side surface covering portion 24 that is formed upon part of the side surface of the piezoelectric body 12. The front surface covering portion 22 is formed along the peripheral portion of the piezoelectric body 12. Due to this, the central portion of the front surface of the piezoelectric body 12 (more accurately, the central portion of the surface electrode 20a) is not covered over by the resin coating layer 14, so that this front surface portion is exposed. And the side surface covering portion 24 is formed to cover over a region around the side surface of the piezoelectric body 12 towards its front side (i.e. its upper side region in FIGS. 1 and 2).

And, as shown in FIG. 2, the resin coating layer 16 extends continuously from the back surface of the piezoelectric body 12 over part of its side surface. The resin coating layer 16 includes a back surface covering portion 26 that is formed upon part of the back surface of the piezoelectric body 12, and a side surface covering portion 28 that is formed upon part of the side surface of the piezoelectric body 12. The back surface covering portion 26 is formed along the peripheral portion of the piezoelectric body 12, like the front surface covering portion 22. Due to this, the central portion of the back surface of the piezoelectric body 12 (more accurately, the central portion of the surface electrode 20b) is not covered over by the resin coating layer 16, so that this back surface portion is exposed. And the side surface covering portion 28 is formed to cover over a region around the side surface of the piezoelectric body 12 towards its back side (its lower side region in FIGS. 1 and 2). Moreover, as will be clear from FIG. 2, the upper edge portion of the resin coating layer 16 is formed over the lower edge portion of the resin coating layer 14, so that the edge portions of the two resin coating layers 14 and 16 are mutually overlapped.

With the piezoelectric element 10 described above, when voltage is applied between the surface electrode 20a and the surface electrode 20b, an electric field is applied in the thickness direction of the piezoelectric layer 18. When this takes place, the piezoelectric layer 18 expands in its thickness direction and also contracts (i.e. deforms) in its planar direction. This piezoelectric element 10 is employed as an actuator by utilizing deformation of the piezoelectric layer 18 (i.e. deformation thereof in its planar direction or in its thickness direction).

With the piezoelectric element 10 of this embodiment, the resin coating layer 14 extends continuously from upon the front surface of the piezoelectric body 12 around to upon its side surface. Due to this, the edge portion of the resin coating layer 14 is not positioned over the edge portion of the piezoelectric body 12 (i.e. over the boundary portion between its front surface and its side surface) or over the corner portions of the front surface of the piezoelectric body 12 (i.e. over its corner portions as seen from above). Accordingly, detachment of the resin coating layer 14 from the piezoelectric body 12 is suppressed. In other words, if the edge portion of the resin coating layer were to be positioned over the edge portion or the corner portions of the piezoelectric body 12, then when, for example, a great change of temperature occurs, due to the difference between the thermal expansion of the piezoelectric body and the thermal expansion of the resin coating layer, a force would operate directly between the resin coating layer and the piezoelectric body 12 and would act to strip away the resin coating layer. On the other hand, in this embodiment, the edge portions of the resin coating layer 14 are formed upon the front surface and upon the side surface of the piezoelectric body 12, so that force to strip away the resin coating layer from the piezoelectric body 12 cannot easily operate directly upon the edge portion of the resin coating layer 14. Due to this, detachment of the resin coating layer 14 from the piezoelectric body 12 is suppressed. As a result, shedding of ceramic particles from the piezoelectric body 12 is suppressed.

Moreover, with this piezoelectric element 10, the resin coating layer 16 extends continuously from upon the back surface of the piezoelectric body 12 to upon its side surface. Due to this, the edge portion of the resin coating layer 16 is not positioned over the edge portion of the piezoelectric body 12 (i.e. over the boundary portion between its back surface and its side surface) or over the corner portions of the back surface of the piezoelectric body 12 (i.e. over its corner portions when seen from below). Accordingly, detachment of the resin coating layer 16 from the piezoelectric body 12 is suppressed. Due to this, the shedding of the ceramic particles from the piezoelectric body 12 is suppressed.

Next, a method for manufacture of this piezoelectric element 10 will be explained. Now, apart from the processes for forming the resin coating layers 14 and 16 upon the piezoelectric element 10, the other processes in this manufacture may be performed by similar methods to those employed in the prior art. Due to this, the processes for forming the resin coating layers 14 and 16 upon the piezoelectric element 10 will be explained in detail, whereas the other processes will only be explained in a simple manner.

First, a piezoelectric wafer 36 is provided that includes a piezoelectric element sheet and surface electrode layers formed upon the front surface and the back surface of that piezoelectric element sheet. (Refer to FIG. 3. It should be understood that, in FIG. 3, the piezoelectric element sheet and the surface electrode layers are omitted.) The manufacture of this piezoelectric wafer 36 may be performed by a publicly known prior art method. For example, the piezoelectric element sheet may be manufactured by shaping a green sheet (typically, a green sheet for which the principal material employed is PZT ceramics (Pb(Zr,Ti)O$_3$ or the like) by a die cutting process. Next, this piezoelectric element sheet is fired at 1000° C. or higher, so that a fired piezoelectric element wafer is obtained. And then electrically conductive paste is screen printed upon the front surface and the back surface of this fired piezoelectric element wafer, and the resultant material is fired. By doing this, the piezoelectric wafer 36 is manufactured.

Figure 3:
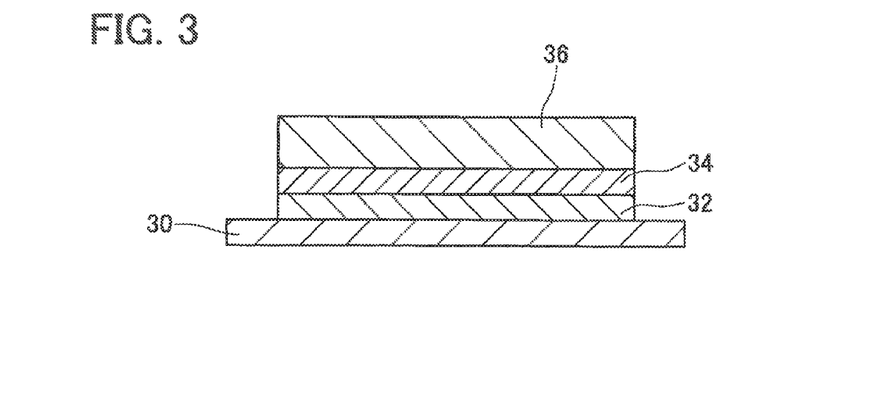
FIG. 3 is a figure for explanation of a first stage of a method of manufacturing this piezoelectric element.

Next, as shown in FIG. 3, the piezoelectric wafer 36 is fixed to a glass substrate 30 with the interposition of a sacrificial layer 34 and an adhesive sheet 32. The sacrificial layer 34 is made from a material that can be dissolved by a specified solvent; for example, it may be made from polyimide that is soluble in an alkali solution, or the like. If polyimide or the like is used for forming the sacrificial layer 34, then TMAH (tetramethylammoniumhydroxide) may be used for the solvent. However, it will be supposed that the solvent is not capable of dissolving the piezoelectric wafer 36, the adhesive sheet 32, or the glass substrate 30. For the adhesive sheet 32, for example, an epoxy resin, a mixture of a polyimide that is not soluble in an alkali solution and an epoxy resin, or the like may be used. By the way, if it is possible to fix the piezoelectric wafer 36 to the glass substrate 30 in a stable manner with only the sacrificial layer 34, then there is no need to use any adhesive sheet 32.

Figure 4:
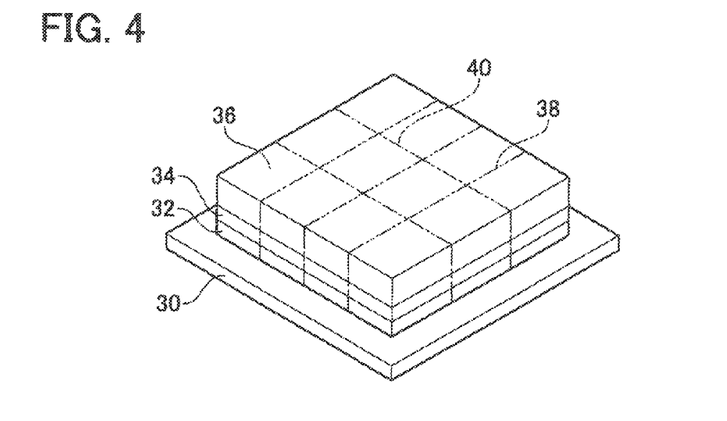
FIG. 4 is a figure for explanation of a second stage of this method of manufacturing the piezoelectric element.

Next, as shown in FIG. 4, the piezoelectric wafer 36, the sacrificial layer 34, and the adhesive sheet 32 are cut apart along dicing lines 38 and 40. By doing this, the piezoelectric wafer 36 is separated into a plurality of pieces, and each of these pieces of the piezoelectric wafer 36 will subsequently become the piezoelectric body 12 of one of the piezoelectric elements 10 described above. Since, as will be clear from the above explanation, the piezoelectric bodies 12 are made by dicing the single piezoelectric wafer 36, accordingly it will be understood that at least two of the side surfaces of each of the piezoelectric bodies 12 are machined surfaces (in other words, are diced surfaces).

Figure 5:
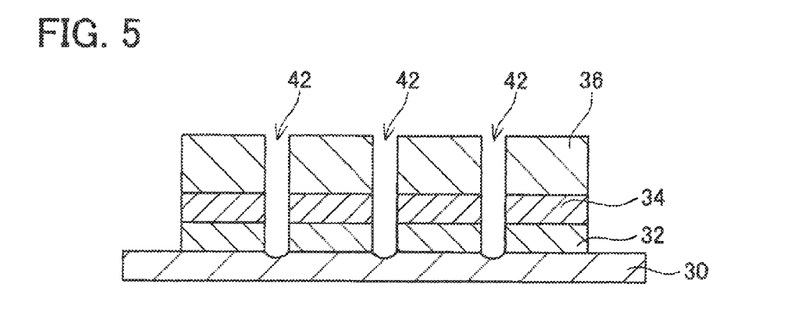
FIG. 5 is a vertical sectional view showing a piezoelectric wafer shown in FIG. 4 in a state after it has been diced.

In the state in which the piezoelectric wafer 36, the sacrificial layer 34, and the adhesive sheet 32 have been cut up, as shown in FIG. 5, dicing grooves 42 are formed around the peripheries of the plurality of piezoelectric bodies 36 that have been thus separated, and moreover a part of the front surface of the glass substrate 30 is divided. Since the front surface of the glass substrate 30 is cut up, accordingly it is possible to ensure that the piezoelectric wafer 36, the sacrificial layer 34, and the adhesive sheet 32 have been completely disconnected and divided up. Incidentally, the width of the dicing grooves 42 is determined by the width of the dicing blade.

Figure 6:
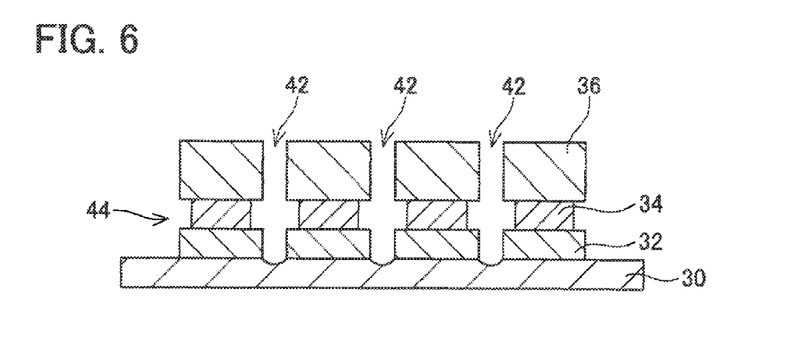
FIG. 6 is a figure for explanation of a third stage of the method of manufacturing the piezoelectric element.

When the piezoelectric wafer 36 has been diced, the piezoelectric bodies 36 are washed in this state in which they are still fixed to the glass substrate 30, so that waste such as ceramic particles and so on adhering to their front and side surfaces due to the dicing is removed. And next, the piezoelectric bodies 36, the sacrificial layers 34, the adhesive sheets 32, and the glass substrate 30 are dipped into the solvent. As described above, the piezoelectric bodies 36, the adhesive sheets 32, and the glass substrate 30 do not dissolve in the solvent, while only the sacrificial layers 34 dissolve. Accordingly, as shown in FIG. 6, by adjusting the time period that the piezoelectric bodies 36, the sacrificial layers 34, the adhesive sheets 32, and the glass substrate 30 are dipped into the solvent, it is possible to eliminate only certain portions of the sacrificial layers 34. Since the sacrificial layers 34 are removed from their peripheries (in other words, from the sides of the dicing grooves 42), accordingly only the central portion of each of the separated piezoelectric bodies 36 remains in the state of being contacted (i.e. fixed) against its sacrificial layer 34. In other words, the periphery of each of the separated piezoelectric bodies 36 is not contacted (i.e. fixed) against any sacrificial layer 34.

Figure 7:
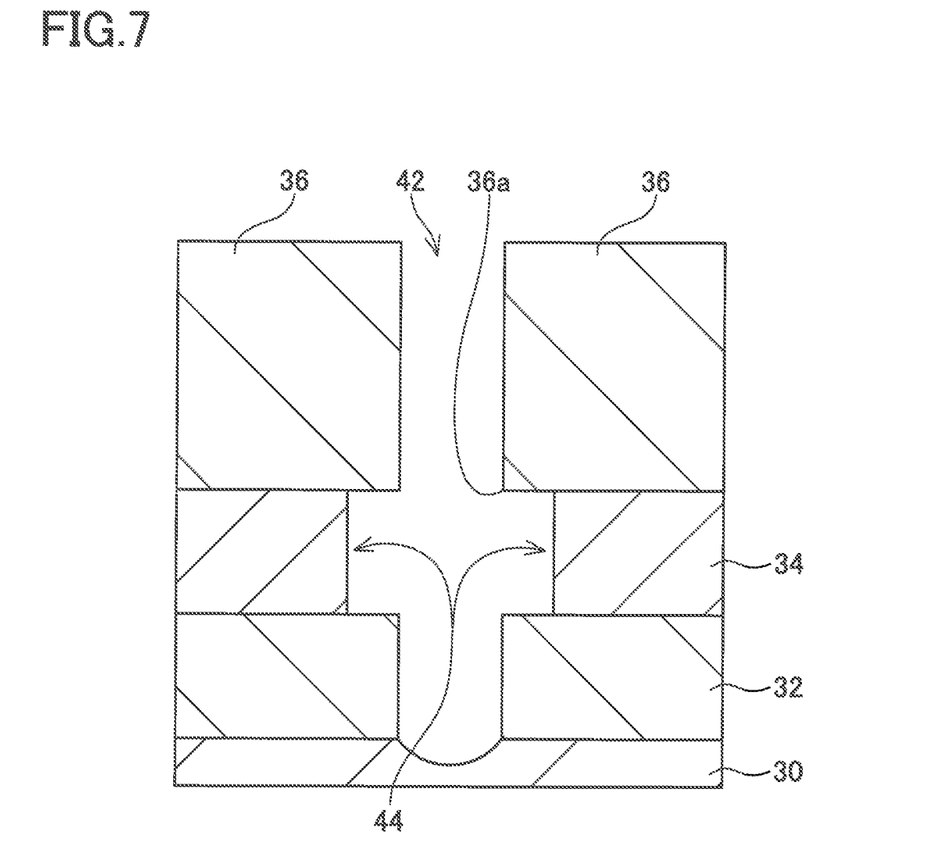
FIG. 7 is a vertical sectional view showing, in magnified view, a portion of the piezoelectric wafer after a sacrificial layer has been removed.

When portions of the sacrificial layers 34 have been dissolved, next, the piezoelectric bodies 36, the sacrificial layers 34, the adhesive sheets 32, and the glass substrate 30 are submerged in a washing liquid, and these members 36, 34, 32, and 30 are subjected to ultrasonic washing. Due to this, ceramic particles that have become detached and have adhered to the machined side surfaces of the piezoelectric bodies 36 (in other words, to the diced surfaces) are eliminated. In other words, in this embodiment, as shown in FIG. 7, only the central portions of the separated piezoelectric bodies 36 are contacted against the sacrificial layers 34, while the peripheral portions of the separated piezoelectric bodies 36 are not contacted against the sacrificial layers 34. Accordingly, washing liquid enters into the spaces 44 between the piezoelectric bodies 36 and the adhesive sheets 32, and thereby the edge portions 36a of the piezoelectric bodies 36 are washed. Due to this, ceramic particles that have broken off and have adhered to the side surfaces of the piezoelectric bodies 36 are removed in an appropriate manner. It should be understood that, even if ultrasonic washing were to be performed in the state shown in FIG. 5, since the peripheral portions of the piezoelectric bodies 36 are contacted against the sacrificial layers 34, accordingly it would be difficult to remove ceramic particles from the vicinities of the edges of the side surfaces of the piezoelectric bodies 36 towards the sacrificial layers 34 (i.e. from near the boundary line between their side surfaces and their back surface), and some cases might occur in which it was not possible to eliminate these ceramic particles even after washing.

Figure 8:
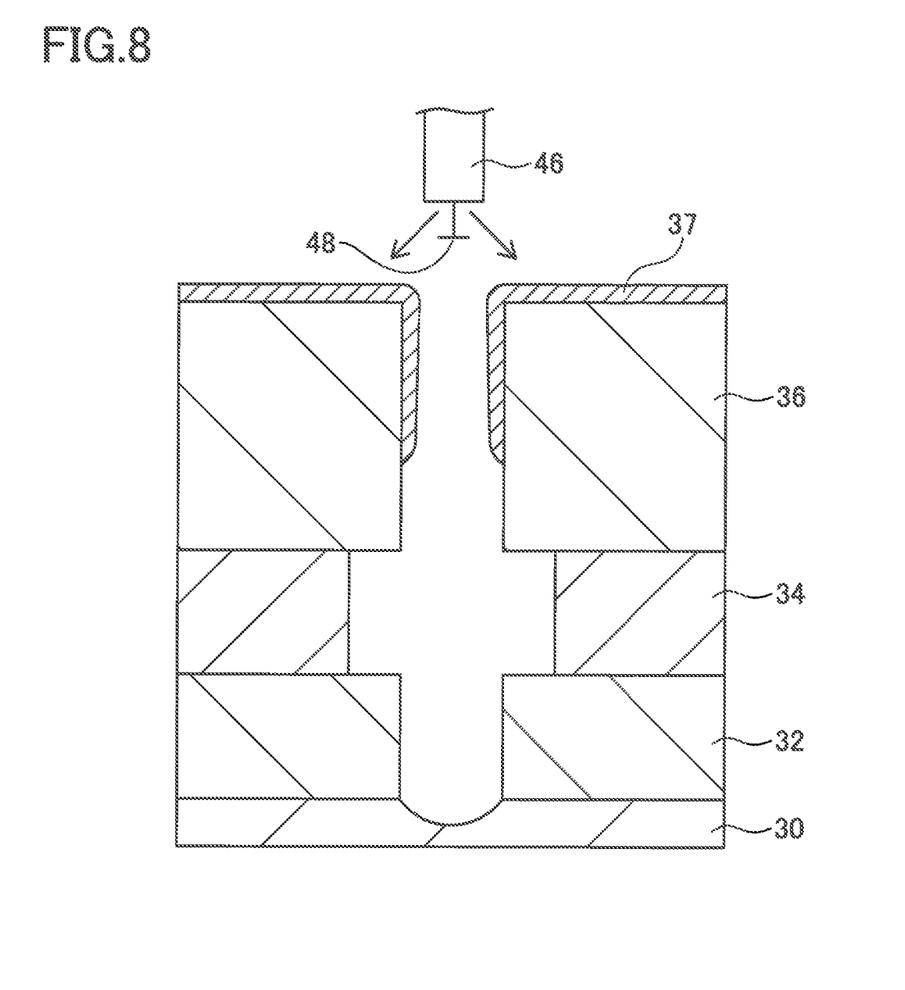
FIG. 8 is a figure for explanation of a fourth stage of the method of manufacturing the piezoelectric element.

Next, as shown in FIG. 8, resin is spray coated upon the front surfaces and upon portions of the side surfaces of the piezoelectric bodies 36. In concrete terms, resin is ejected from the end of a nozzle 46, and thereby this resin is applied to the entire front surfaces of the separated piezoelectric bodies 36 and to portions of their side surfaces. Since a shield plate 48 is provided at the end of the nozzle 46, accordingly the resin is ejected slantingly from the nozzle 46 towards the piezoelectric bodies 36. Due to this, resin is only applied to portions of the side surfaces of the separated piezoelectric bodies 36 (i.e., to regions on their side surfaces), while the resin that is ejected from the nozzle 46 is prevented from becoming filled into the spaces 44 between the piezoelectric bodies 36 and the adhesive sheets 32. Due to this, in the next process, it is possible to perform removal of the sacrificial layer 34 simply and easily. By thus performing spray coating of the resin, resin layers 37 are formed over the entire front surfaces and over portions of the side surfaces of the separated piezoelectric bodies 36. Next, the central portions of the resin layers 37 that have thus been formed over the entire front surfaces of the piezoelectric bodies 36 are removed, so that they remain only over their edge portions (in other words, they are patterned). This patterning of the resin layers 37 may be performed by a publicly known method. For example, if the resin layers 37 are made from a photosensitive resin material, then, by exposing portions of the resin layers 37, it is possible to eliminate the resin material over any desired range. Thereafter, the resin layers 37 that have thus been patterned are cured (i.e. hardened) by application of heat, and are thereby fixed to the front surfaces of the piezoelectric bodies 36, so that the resin coating layers 14 of the piezoelectric elements 10 described above are formed. Incidentally, it is desirable to apply heat during this spray coating of the resin, so that the temperature of the front surfaces of the piezoelectric bodies 36 to which the resin is applied is raised to 35° C. to 100° C. Due to heat thus being applied to the piezoelectric bodies 36 while the resin is being sprayed, liquid drops of the sprayed resin adhere to the front surfaces of the piezoelectric bodies 36 and the solvent therein is vaporized. Because of this, the fluidity of the liquid drops is reduced, and, due to the application of the heat for curing, it is possible to prevent the resin layers from being hardened in a state in which the resin layers have been pulled off from the edge portions between the front surfaces and the side surfaces of the piezoelectric bodies 36 (in other words, in a state in which the edge portions are exposed). In other words, it is possible to make the thickness of the coating layers at the edge portions between the front surfaces and the side surfaces of the piezoelectric bodies 36 thicker.

Next, the sacrificial layers 34 are thoroughly dissolved away by the solvent, and thereby the separated piezoelectric bodies 36 are separated from the glass substrate 30. And next, resin is applied to portions of the back surfaces and the side surfaces (i.e. the side surface regions) of each of the separated piezoelectric bodies 36. As the method for application of the resin, this may be performed by a similar method to that shown in FIG. 8 above. Due to this, resin is applied to portions of the back surface and the side surface of each of the piezoelectric bodies 36, and resin coating layers 16 are formed by patterning and curing this resin. The piezoelectric elements 10 of this embodiment are manufactured in the above manner.

As will be clear from the above explanation, with the method for manufacturing the piezoelectric element 10 of this embodiment, the piezoelectric wafer 36 is fixed to the glass substrate 30 via the sacrificial layer 34. And, after the piezoelectric wafer 36 has been diced, the sacrificial layer 34 is partially dissolved, and in this state the front surface of the piezoelectric wafer 36 is washed with ultrasound. Due to this, it is possible to remove ceramic particles that have become detached and that are adhering to the side surfaces of the piezoelectric body 36 in an appropriate manner. In this way, it is possible to suppress shedding of the ceramic particles during use. Moreover, since it is possible to remove the large ceramic particles that have become detached and are adhering before performing the coating process, accordingly it is possible effectively to suppress the occurrence of ceramic particle contamination during use by employing a thin resin coating having thickness of the same order as the diameter of the ceramic particles. In particular, in the case of a piezoelectric element, if the thickness of the layer of coating resin becomes thick, then deformation of the piezoelectric element is hampered, and it is not possible to obtain a sufficient performance from the piezoelectric element. The point is that, with the piezoelectric element 10 of this embodiment, since it is possible to make the thickness of the resin coating layers 14 and 16 very thin while still suppressing the occurrence of ceramic particle contamination, accordingly there is no hampering of the deformation of the piezoelectric element 10, and it is possible to provide sufficient performance.

The correspondence relationship between the structure of this embodiment and the description of the Claims will now be explained. The piezoelectric layer 18 is an example of the "ceramic layer"; the piezoelectric body 12 is an example of the "ceramic body"; the resin coating layer 14 is an example of the "first coating layer"; the resin coating layer 16 is an example of the "second coating layer", the piezoelectric wafer 36 is an example of the "ceramic wafer"; and the glass substrate 30 is an example of the "supporting plate".

Figure 9:
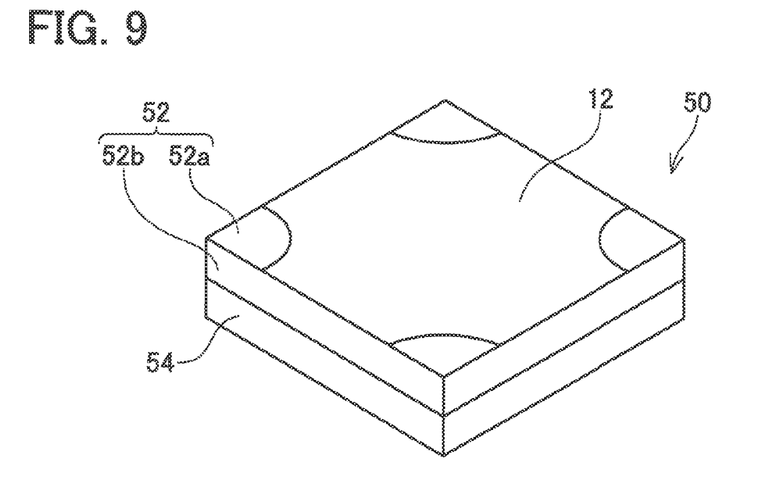
FIG. 9 is a perspective view of a piezoelectric element according to a variant of this first embodiment.

Now while, with the piezoelectric element 10 of the embodiment described above, the resin coating layers 14 and 16 were formed over the entire peripheral portions of the front surface and the back surface of the piezoelectric body 12, the technique disclosed in this specification is not limited to this feature. For example, as shown in FIG. 9, which is a piezoelectric element 50 that is a variation of the first embodiment, it would also be possible to cover the four corner portions 52a of the front surface of the piezoelectric body 12 with a resin coating layer 52, and to cover the four corner portions of the back surface of the piezoelectric body 12 with a resin coating layer 54. Depending upon the way in which the piezoelectric element is used, the corner portions of the front surface and the back surface of the piezoelectric body 12 are sometimes the locations where the ceramic particles most likely become detached. In a case of this type, by covering the corner portions of the front surface and the back surface of the piezoelectric body 12 with the resin coating layers 52 and 54, it is possible to suppress the shedding of the ceramic particles in an appropriate manner.

Moreover while, with the piezoelectric element 10 of the embodiment described above, processing to dissolve a portion of the sacrificial layer 34 is performed immediately after the piezoelectric wafer 36 has been diced and washed, the technique disclosed in this specification is not limited to this feature. For example, after having diced and washed the piezoelectric wafer 36, it would also be possible further to perform processing to coat the front surface of the piezoelectric wafer 36 with a resin paste. For example, after dicing, the piezoelectric wafer 36, the sacrificial layer 34, the adhesive sheet 32, and the glass substrate 30 may be dipped into a solvent of resin paste. Thereafter, the piezoelectric wafer 36, the sacrificial layer 34, the adhesive sheet 32, and the glass substrate 30 are spun around, and the excess resin paste adhering to their front surfaces is eliminated. Next, they are dried at a temperature less than the boiling point of the solvent of the resin paste, and then the resin paste is cured (i.e. is hardened). When a method of this type is employed, it is possible to block the interiors of minute indentations or micro-cracks in the side surfaces (i.e. the diced surfaces) of the piezoelectric wafer 36 with the resin paste. Due to this, it is possible further to prevent shedding of ceramic particles. Moreover, in addition to the above procedure, it would also be possible to flow the resin paste into the interiors of the dicing grooves 42, and, thereafter, to remove the excess resin paste by a spin coating method or the like. It is possible to fill up indentations and so on in the side surfaces of the piezoelectric bodies 36 with resin by using this method as well.

Second Embodiment

With a piezoelectric element of a second embodiment, the feature that the entire side surface of the piezoelectric body 12 and a portion of the back surface of the piezoelectric body 12 are covered over by the resin coating layer 62 that covers the front surface of the piezoelectric body 12, is different from the case of the first embodiment. Since the other structures are similar to ones of the piezoelectric element 10 of the first embodiment, accordingly explanation thereof will be omitted. Moreover, to elements and structures that are the same as ones of the piezoelectric element 10 of the first embodiment, the same reference symbols will be appended.

Figure 10:
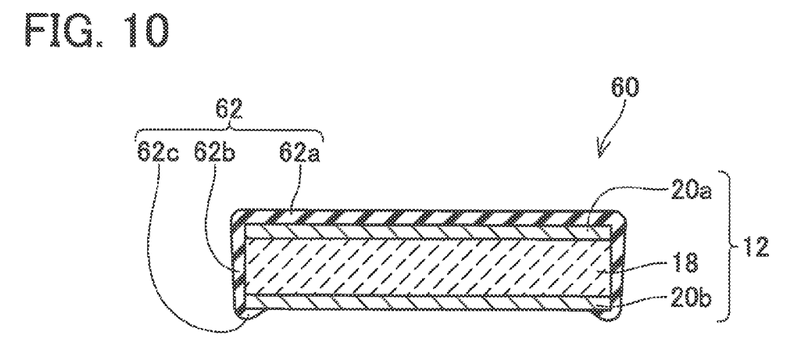
FIG. 10 is a vertical sectional view of a piezoelectric element according to a second embodiment (and corresponds to the cross section shown in FIG. 2)

As shown in FIG. 10, with this piezoelectric element 60 of the second embodiment, the resin coating layer 62 extends continuously from the front surface of the piezoelectric body 12 over its side surface, and from its side surface onto its bottom surface. The resin coating layer 62 includes a front surface covering portion 62a that is formed upon a portion of the front surface of the piezoelectric body 12, a side surface covering portion 62b that is formed over the side surface of the piezoelectric body 12, and a back surface covering portion 62c that is formed upon the back surface of the piezoelectric body 12. The front surface covering portion 62a, as in the first embodiment, is formed over the peripheral portion of the front surface of the piezoelectric body 12 (refer to FIG. 1). The side surface covering portion 62b covers the entire side surface of the piezoelectric body 12. And the back surface covering portion 62c is formed over the peripheral portion of the back surface of the piezoelectric body 12. However, the area which this back surface covering portion 62c covers is smaller than the area that the front surface covering portion 62a covers. In other words, the width of the back surface covering portion 62c (i.e. its width inwards from the lower edge of the piezoelectric body 12) is less than the width of the front surface covering portion 62a (i.e. its width inwards from the upper edge of the piezoelectric body 12). Moreover, the thickness of the back surface covering portion 62c is less than the thickness of the front surface covering portion 62a. Since, in this second embodiment as well, the front surface covering portion 62a, the side surface covering portion 62b, and the back surface covering portion 62c extend continuously, accordingly the edge portion of the resin coating layer 62 is not positioned over the edge portion of the front surface of the piezoelectric body 12 or over the edge portion of its back surface, or over the corner portions of the piezoelectric body 12 on its front surface and its back surface. Accordingly detachment of the resin coating layer 62 from the piezoelectric body 12 is suppressed, in the same manner as in the first embodiment.

Figure 11:
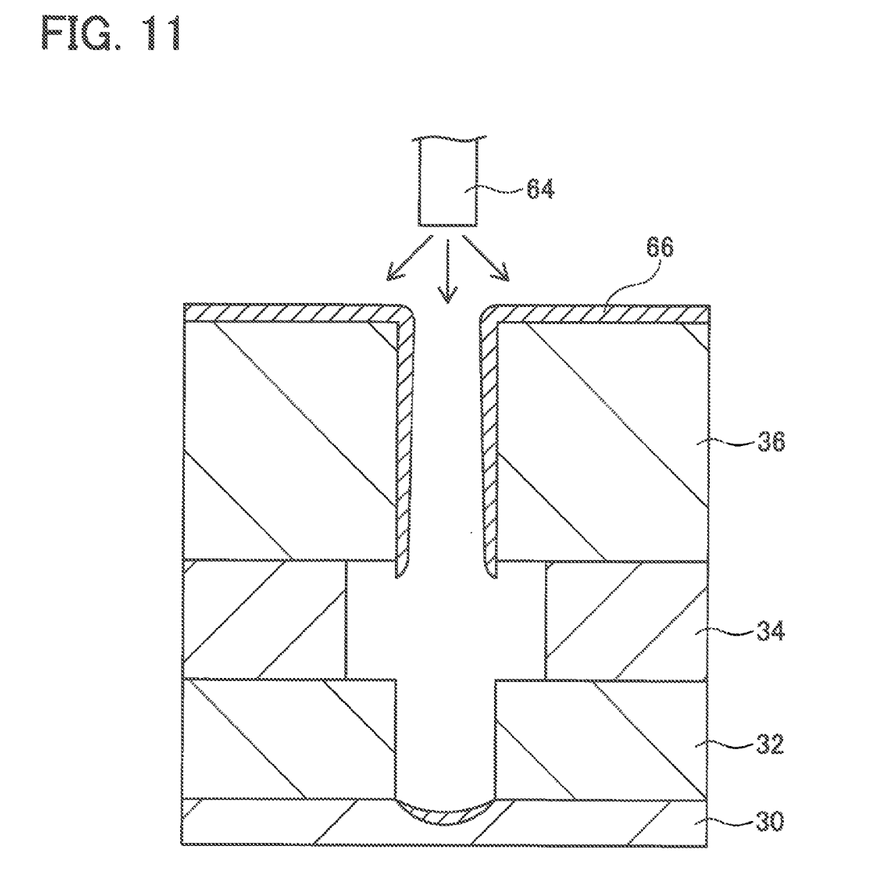
FIG. 11 is a figure for explanation of a first stage of a method of manufacturing this piezoelectric element according to the second embodiment.
Figure 12:
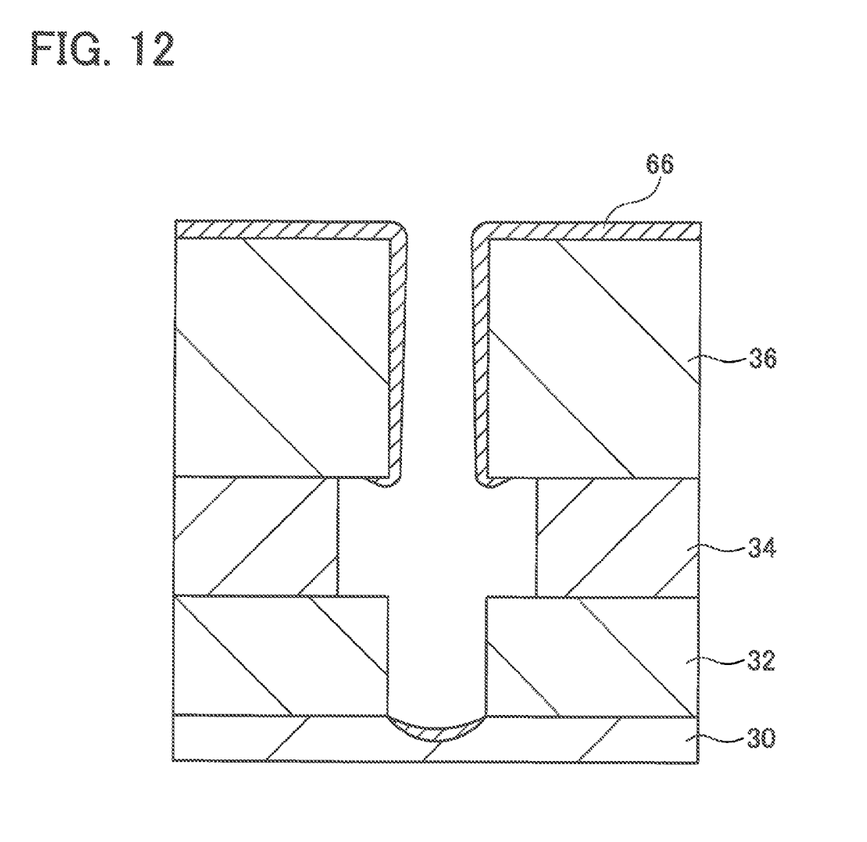
FIG. 12 is a figure for explanation of a second stage of a method of manufacturing this piezoelectric element according to the second embodiment.

This piezoelectric element 62 of the second embodiment may be manufactured by a similar method to that employed for the first embodiment. However, with the piezoelectric element 62 of the second embodiment, due to the resin coating layer 62, the method for forming the resin coating layer upon the piezoelectric wafer 36 in order for the front surface, the side surface, and the back surface of the piezoelectric body 12 to be covered, is different from that in the case of the first embodiment. That is, as shown in FIG. 11, coating of the resin upon the piezoelectric bodies 36 is performed by spraying the resin from a nozzle 64. However, the nozzle 64 is not provided with any shield plate, so that this feature is different from the case of the first embodiment. Due to this, the resin that is ejected from the nozzle 64 covers over the entire side surfaces of the piezoelectric bodies 36. In this second embodiment, due to the fact that a comparatively large quantity of resin is coated, the lower edges of the resin layers 66 come to be positioned somewhat below the lower surfaces of the piezoelectric bodies 36 (this state is shown in FIG. 11). Thereafter, the resin layers 66 are cured (i.e. hardened). When this is done, as shown in FIG. 12, the resin layers 66 contract because of change of volume, and due to this the lower edges of the resin layers 66 curl back and contact against and become fixed to the back surfaces of the piezoelectric bodies 36. Accordingly, it is possible to manufacture the resin coating layers 62 with one episode of spray coating and curing resin. It should be understood that the other aspects of this method for manufacture may be performed in a similar manner to the case of the first embodiment.

Figure 13:
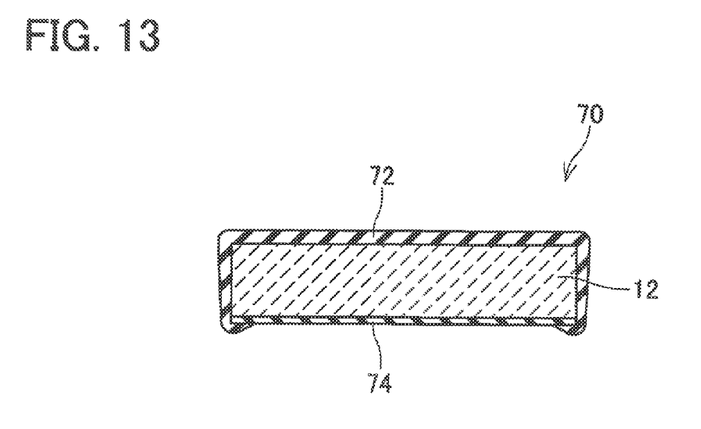
FIG. 13 is a vertical sectional view of a piezoelectric element according to a variant of the second embodiment.

Moreover, in a variant of the second embodiment, as shown in FIG. 13, a resin coating layer 74 may be formed upon the back surface of a piezoelectric element 70. In this case, the lower edge portion of a resin coating layer 72 that covers over the front surface and the side surface of the piezoelectric body 12 is formed over the resin coating layer 74. According to this type of configuration, it is possible to protect the back surface of the piezoelectric element 70 with the resin coating layer 74. Moreover, by forming the resin coating layer 74 on the back surface of the piezoelectric wafer 36 in advance, the piezoelectric element 70 shown in FIG. 13 may be manufactured by a similar method to that of the second embodiment.

Figure 14:
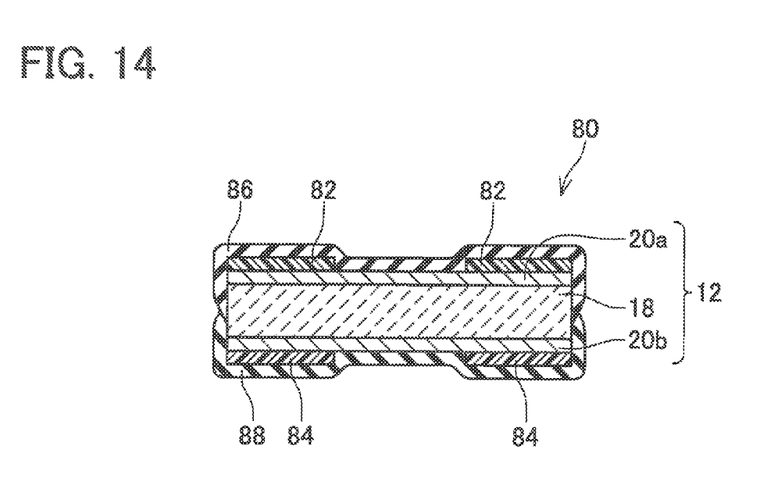
FIG. 14 is a vertical sectional view of a piezoelectric element according to a variant of the first embodiment (and corresponds to the cross section shown in FIG. 2).

Moreover, in the various piezoelectric elements of the embodiments described above, it would also be possible to change the thickness of the resin coating layer according to the location. For example, by making the thickness of the resin coating layer at the corner portions of the front surface or of the back surface of the piezoelectric body 12 thicker than that of the other portions, it would be possible to leave a comparatively large clearance between the central portion of the front surface or of the back surface of the piezoelectric body 12 and an installation surface (i.e. a surface upon which the piezoelectric element is installed). Due to this, it would be possible to prevent deformation and so on of the piezoelectric element from being constrained. For example, with the piezoelectric element 80 shown in FIG. 14, a first resin coating layer 82 is formed at the corner portions of the front surface of the piezoelectric body 12, and a second resin coating layer 84 is formed at the corner portions of the back surface of the piezoelectric body 12. In concrete terms, resin coating layers 82 and 84 are formed over the corner portions of the front surface and of the back surface of the piezoelectric body 12, as with the resin coating layer 52a shown in FIG. 9. And a third resin coating layer 86 is formed over the first resin coating layer 82, while a fourth resin coating layer 88 is formed over the second resin coating layer 84. It is possible to change the thickness of the resin coating layer according to location by making a plurality of resin coating layers having different patterns in this manner.

The present embodiments are described above in detail, but these examples are merely illustrative and place no limitation on the scope of the patent claims. The technology described in the patent claims also encompasses various changes and modifications to the specific examples described above. Further, it is to be understood that the technical elements described in the present specification and the drawings exhibit technical usefulness solely or in various combinations thereof and shall not be limited to the combinations described in the claims at the time of filing. Furthermore, the techniques illustrated in the present specification and the drawings are to achieve a plurality of objectives at the same time, whereby technical usefulness is exhibited by attaining any one of such objectives.

The invention claimed is:

1. A ceramic element comprising:
a ceramic body including one or more laminated ceramic layers;
a first coating layer disposed on a first part of a front surface of the ceramic body; and
a second coating layer disposed on a second part of a back surface of the ceramic body; wherein
the first coating layer continuously extends from the front surface of the ceramic body to a first region of a side surface of the ceramic body, the side surface being a machined surface, and the first region being a region extending towards the back surface from a boundary between the side and front surfaces of the ceramic body,
the second coating layer continuously extends from the back surface of the ceramic body to a second region of the side surface of the ceramic body, the second region being a region extending towards the front surface from a boundary between the side and back surfaces of the ceramic body, and
on the machined surface of the ceramic body, one of the first and second coating layers is disposed partially on the other of the first and second coating layers.

2. The ceramic element as in claim 1, wherein
in a planar view, the ceramic body has a rectangular shape, and
the first coating layer is disposed on at least four corners of the front surface of the ceramic body.

3. The ceramic element as in claim 2, wherein
the first coating layer is disposed along peripheral edges of the front surface of the ceramic body.

4. A ceramic element comprising:
a ceramic body including one or more laminated ceramic layers;
an electrode formed on at least one of front and back surfaces of the ceramic body; and
a coating layer disposed on a part of the front surface of the ceramic body;
wherein the coating layer is a resin and continuously extends beyond a boundary between side and back surfaces of the ceramic body, reaches a peripheral part of the back surface of the ceramic body, and is disposed on the entire side surface which is a machined surface, and
wherein, in a cross-section perpendicular to a thickness of the ceramic body, a width of the coating layer disposed on the back surface of the ceramic body in a direction parallel to the back surface of the ceramic body is less than a width of the coating layer disposed on the front surface of the ceramic body in a direction parallel to the front surface of the ceramic body.

* * * * *